United States Patent
Guter et al.

(10) Patent No.: US 9,972,735 B2
(45) Date of Patent: May 15, 2018

(54) OPTOCOUPLER HAVING A SEMICONDUCTOR DIODE FOR EACH VOLTAGE SOURCE AND A TUNNEL DIODE FORMED BETWEEN EACH TWO SUCCESSIVE VOLTAGE SOURCES

(71) Applicant: AZUR SPACE Solar Power GmbH, Heilbronn (DE)

(72) Inventors: Wolfgang Guter, Stuttgart (DE); Daniel Fuhrmann, Heilbronn (DE); Victor Khorenko, Neuenstadt a.K. (DE)

(73) Assignee: Azur Space Solar Power GmbH, Heilbronn (DE)

( * ) Notice: Subject to any disclaimer, the term of this patent is extended or adjusted under 35 U.S.C. 154(b) by 159 days.

(21) Appl. No.: 15/180,753

(22) Filed: Jun. 13, 2016

(65) Prior Publication Data
US 2016/0365470 A1    Dec. 15, 2016

(30) Foreign Application Priority Data
Jun. 12, 2015    (DE) .......................... 10 2015 007 326

(51) Int. Cl.
*H03K 17/18*    (2006.01)
*H04B 10/40*    (2013.01)
(Continued)

(52) U.S. Cl.
CPC ........ *H01L 31/173* (2013.01); *H01L 23/3171* (2013.01); *H01L 27/0676* (2013.01);
(Continued)

(58) Field of Classification Search
CPC . H01L 31/167; H01L 31/0304; H01L 31/173; H01L 25/167; H01L 29/88; H04B 10/40; H03K 17/78
(Continued)

(56) References Cited

U.S. PATENT DOCUMENTS 4,127,862 A    11/1978    Ilegems et al.
4,354,115 A    10/1982    Warabisako et al.
(Continued)

FOREIGN PATENT DOCUMENTS

CN    103403874 A    11/2013
CN    103545389 A    1/2014
(Continued)

OTHER PUBLICATIONS

Kalkhoran et al., "Cobalt disilicate intercell ohmic contacts for multijunction photovoltaic energy converters," Appl. Phys. Lett., vol. 64, No. 15, pp. 1980-1982 (Apr. 11, 1994).
(Continued)

*Primary Examiner* — Que T Le
(74) *Attorney, Agent, or Firm* — Muncy, Geissler, Olds & Lowe, P.C.

(57) ABSTRACT

An optocoupler having a transmitter module and a receiver module that are galvanically isolated from each other and optically coupled with one another and are integrated in a common housing. The receiver module has a voltage source that has a number N of partial voltage sources mutually connected in series and constructed as semiconductor diodes. Each of the partial voltage sources has a semiconductor diode having a p-n junction, and the partial source voltages of the individual partial voltage sources each deviate by less than 20% from one another. Between each two successive partial voltage sources, a tunnel diode is formed and the partial voltage sources and the tunnel diodes are monolithically integrated together and jointly form a first stack having a top surface and a bottom surface, and the number N of the partial voltage sources is greater than or equal to three.

16 Claims, 3 Drawing Sheets

(51) Int. Cl.
  *H01L 31/173* (2006.01)
  *H01L 31/0304* (2006.01)
  *H01L 31/167* (2006.01)
  *H01L 23/31* (2006.01)
  *H01L 27/06* (2006.01)

(52) U.S. Cl.
  CPC .... *H01L 31/0304* (2013.01); *H01L 31/03046* (2013.01); *H01L 31/167* (2013.01); *H04B 10/40* (2013.01); *Y02E 10/544* (2013.01); *Y02P 70/521* (2015.11)

(58) Field of Classification Search
  USPC .................. 250/551, 214 R, 221, 559.12
  See application file for complete search history.

(56) References Cited

U.S. PATENT DOCUMENTS

| | | |
|---|---|---|
| 4,996,577 A | 2/1991 | Kinzer |
| 5,753,928 A * | 5/1998 | Krause .................. H01L 31/173 250/214.1 |
| 6,239,354 B1 | 5/2001 | Wanlass |
| 8,350,208 B1 | 1/2013 | Zhang et al. |
| 8,962,993 B2 | 2/2015 | Jones-Albertus et al. |
| 2006/0048811 A1 | 3/2006 | Krut et al. |
| 2008/0163290 A1 | 7/2008 | Meusel et al. |
| 2010/0096001 A1 | 4/2010 | Sivananthan et al. |
| 2015/0162478 A1 | 6/2015 | Fafard et al. |
| 2015/0380591 A1 | 12/2015 | Bett et al. |

FOREIGN PATENT DOCUMENTS

| | | |
|---|---|---|
| CN | 103594539 A | 2/2014 |
| DE | 10 2010 001 420 A1 | 8/2011 |
| JP | S 56-78180 A | 6/1981 |
| TW | 201327875 A1 | 7/2013 |
| WO | WO 2013/067969 A1 | 5/2013 |
| WO | WO 2014/096200 A1 | 6/2014 |

OTHER PUBLICATIONS

Bett et al., "III-V Solar Cells Under Monochromatic Illumination," 33$^{rd}$ IEEE Photovoltaic Specialists Conf. (PSVC '08), pp. 1-5 (2008).

Valdivia et al., "Five-volt vertically-stacked single-cell GaAs photonic power converter," Phys, Sim & Phot Eng of Photovolt Devices IV, vol. 9358, pp. 1-8 (Mar. 16, 2015).

Schubert et al., "High-Voltage GaAs Photovoltaic Laser Power Converters," IEEE Trans. on Elect. Devices, vol. 56, No. 2, pp. 170-175 (Feb. 1, 2009).

* cited by examiner

US 9,972,735 B2

OPTOCOUPLER HAVING A SEMICONDUCTOR DIODE FOR EACH VOLTAGE SOURCE AND A TUNNEL DIODE FORMED BETWEEN EACH TWO SUCCESSIVE VOLTAGE SOURCES

This nonprovisional application claims priority under 35 U.S.C. § 119(a) to German Patent Application No. 10 2015 007 326.5, which was filed in Germany on Jun. 12, 2015, and which is herein incorporated by reference.

BACKGROUND OF THE INVENTION

Field of the Invention

The invention relates to an optocoupler.

Description of the Background Art

Optocouplers are well known. Simple optocouplers have a transmitter module and a receiver module, wherein the two modules are galvanically isolated, but optically coupled. Such devices are known from U.S. Pat. No. 4,996,577. Optical devices are also known from US 2006/0048811 A1, U.S. Pat. No. 8,350,208 and WO 2013/067969 A1.

Further known from U.S. Pat. No. 4,127,862, U.S. Pat. No. 6,239,354, DE 10 2010 001 420 A1, from Nader M. Kalkhoran, et al, "Cobalt disilicide intercell ohmic contacts for multijunction photovoltaic energy converters", Appl. Phys. Lett. 64, 1980 (1994) and from A. Bett et al, "III-V Solar cells under monochromatic illumination", Photovoltaic Specialists Conference, 2008, PVSC '08. 33rd IEEE, page 1-5, ISBN: 978-1-4244-1640-0 are scalable voltage sources or solar cells made of III-V materials.

SUMMARY OF THE INVENTION

It is therefore an object of the invention to provide an apparatus which further develops the prior art.

According to an exemplary embodiment of the invention, an optical coupler is provided, having a transmitter module and a receiver module, the transmitter module and the receiver module being galvanically isolated from each other and optically coupled with each other, and the two modules being integrated in a common housing, and the receiver module comprising a voltage source, wherein the voltage source comprises a number N of mutually series-connected partial voltage sources constructed as semiconductor diodes, each of the partial voltage sources having a semiconductor diode comprising a p-n junction, and each semiconductor diode having a p-doped absorption layer, wherein the p-doped absorption layer is passivated by a p-doped passivation layer having a wider band gap than the band gap of the p-absorption layer and the semiconductor diode comprises an absorption layer, wherein the n-absorption layer is passivated by an n-doped passivation layer having a wider band gap than the band gap of the n-absorption layer, and the partial source voltages of the individual partial voltage sources deviate by less than 20% from one another, and a tunnel diode is formed in each case between two successive partial voltage sources, wherein the tunnel diode has a plurality of semiconductor layers with a wider band gap than the band gap of the p/n absorption layers and the semiconductor layers having the wider band gap in each case is formed of a material with a changed stoichiometry and/or other elemental composition than the p/n-absorption layers of the semiconductor diode, and the partial voltage sources and the tunnel diodes are monolithically integrated together and jointly form a first stack having a top surface and a bottom surface, and the number N of the partial voltage sources is greater than/equal to three, and the light on the top surface is incident on the first stack and the size of the illuminated area on the stack top surface is substantially the size of the area of the first stack on the top surface, and the first stack has a total thickness of less than 12 microns, and that at 300K, the first stack has a source voltage greater than 3 volts, insofar as the first stack is irradiated with a photon flux, and wherein in the light incident direction from the top surface of the stack toward the bottom surface of the first stack, the total thickness of the p and n-absorption layers of a semiconductor diode increases from the topmost diode toward the lowest diode and the voltage source near the bottom surface of the stacks has a circumferential, shoulder-like edge.

It should be noted that the expression can be substantially understood to be a correlation of the comparison of the illuminated area at the top surface of the stack with the size of the surface of the first stack at the top side, a difference in the surface in particular lesser than 20% or preferably lesser than 10% or preferably lesser than 5% or most preferably the two surfaces are equal.

The term "light" for the illumination of the top surface of the stack can be understood to have a spectrum of wave lengths in the absorption area of the absorption layers. It is understood that a monochromatic light which has a specific, i.e., absorbent wave length, i.e., a wave length in the absorption area of the absorption layers, is also suitable.

It is noted that as long as the photon emission in the transmitter module is subject to a modulation, the modulation causes an alternating voltage, in other words, the level of the source voltage changes over time. It should also be noted that preferably the entire top surface of the first stack, i.e. the entire or almost the entire surface can be irradiated with light of a particular wavelength.

The term light can have a specific wavelength, for example, the light of an LED, and that the emission spectrum can be generally Gaussian-shaped and, for example, in a typical 850 nm-LED, has a half-value width of 20-30 nm. The wavelength of the light can be at least greater than or equal to the band gap energy of the absorption layers of the semiconductor diodes.

It should be noted that detailed studies surprisingly showed that in contrast to the prior art, source voltages above 3V advantageously result with the monolithic stack approach at hand.

The number N of partial voltage sources can be below ten and that the level of the source voltage of the first stack can be determined mainly by adding the partial source voltages.

An advantage of the inventive device is that by the series connection of a plurality of partial voltage sources, a power source with voltage values above four or more volts can be realized, and by means of a monolithically integrated structure, a simple and inexpensive as well as reliable power source can be produced. Another advantage is that by using the stacked arrangement as compared to the previous lateral arrangement with silicon diodes, a large space savings results. In particular, only the significantly smaller receiving surface of the first stack of the receiver module needs to be illuminated by the transmitter diode or the light source.

The number N of the partial voltage sources can be greater than or equal to three and the first stack can have a source voltage greater than 3 volts at 300 K, provided that the first stack is irradiated with a photon flux at a particular wavelength.

In an embodiment, the source voltage of the individual partial voltage sources among each other can differ less than 10%. In this way, the usability as a scalable voltage source, in particular as a reference voltage source, is significantly improved. It is understood that the term "scalability" refers to the level of the source voltage of the entire stack.

In an embodiment, the semiconductor diodes each can be formed of the same semiconductor material, wherein the semiconductor material of the diodes hereby has the same crystalline composition and wherein the stoichiometry can be nearly or preferably exactly the same. It is also advantageous to arrange the first stack on a substrate. In an embodiment, the semiconductor material and/or the substrate is made of III-V materials. The substrate can comprise germanium or gallium arsenide and/or the semiconductor layers can have arsenic and/or phosphorus on the substrate. In other words, the semiconductor layers can comprise As-containing layers and P-containing layers, i.e., layers of GaAs or AlGaAs or InGaAs as examples of arsenide layers, and InGaP as an example of phosphide layers.

A second voltage terminal can be formed on the bottom surface of the first stack and the second voltage terminal can be formed by the substrate.

In an embodiment, the semiconductor diodes can be made of the same material as the substrate. An advantage is in particular that then, the expansion coefficient of the two parts are the same. It is advantageous if the semiconductor diodes basically is formed of one III-V material. It is particularly advantageous if the semiconductor diodes each are formed of the same semiconductor material. In particular, it is preferred to use GaAs.

In an embodiment, a first voltage terminal can be formed at the top surface of the first stack as a circumferential metal contact in the vicinity of the edge, or as a single contact area at the edge.

Furthermore, the first stack can have a base area smaller than 2 mm$^2$ or smaller than 1 mm$^2$. The base can be designed in a quadrangular manner. Preferably, the base area of the stack is shaped as a square.

In order to achieve even higher voltages, it is advantageous to form a second stack and to connect the two stacks together in series so that the source voltage of the first stack and the source voltage of the second stack are added together. For example, the first stack and the second stack can be arranged side by side on a common carrier.

In an embodiment, the source voltage of the first stack deviates from the source voltage of the second stack by less than 15%.

An evaluation circuit can be integrated in the housing and when the power source is in electrical operative connection with the evaluation circuit. In a preferred embodiment, the receiver module includes an integrated semiconductor mirror, wherein the semiconductor mirror is preferably monolithically integrated, highly preferably, integrated in each stack.

Furthermore, below the lowermost semiconductor diode of the stack, a semiconductor mirror can be formed. A plurality of stacks can be formed side by side on a semiconductor wafer or semiconductor substrate wafer by performing a so-called mesa etching after the whole-surface, preferably epitaxial, production of the layers. For this purpose, a resist mask can be generated via a mask process and then preferably, a wet chemical etching is carried out to produce mesa trenches. The mesa etching preferably stops in the substrate or on the substrate.

In an embodiment, an intrinsic layer can be formed between the p-absorption layer and the n-absorption layer of the respective diode. In this case, an intrinsic layer is understood to be a semiconductor layer with a doping less than 1E16 1/cm$^2$, preferably less than 5E15 1/cm$^2$, most preferably less than 1.5 E15 1/cm$^2$.

In an embodiment, each stack can have a circumferential, shoulder-like edge in the vicinity of the bottom surface, wherein in two immediately adjacent stacks on the outer sides of the stack structure, the circumferential edge is formed as a common peripheral edge so that the voltage source has a circumferential edge.

The edge can be designed step-like or as a step. The edge or step surface hereby can have a plane surface, wherein the normal of the edge or step surface can be designed to be parallel or nearly parallel to the normal of the surface of the first stack or to the normal of the surfaces of the respective stacks. It should be noted that the lateral surface of the edge or the step can be designed to be mostly or exactly perpendicular to the surface of the edge or step.

The border of the edge or the step can be spaced at least 5 microns and maximally 500 microns apart in each case from each of the four lateral surfaces of the first stack or in each case from the lateral surfaces of multiple stacks. The distance range of the border to the immediately adjoining lateral surface can be in each case between 10 microns and 300 microns. In particular, the distance range can be between 50 microns and 250 microns.

The lateral surfaces of the first stack and in particular all lateral surfaces of the stack can be designed to be planar and in particular perpendicular or nearly perpendicular. In particular, the normals on lateral surfaces as compared to the normals of the adjoining edge surfaces or the normals of the top surfaces of the stack are at an angle range between 80° and 110°, i.e. the normal of a lateral surface and the edge surface immediately adjoining are substantially positioned orthogonally to one another. Preferably, the angle range is between 85° and 105°.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
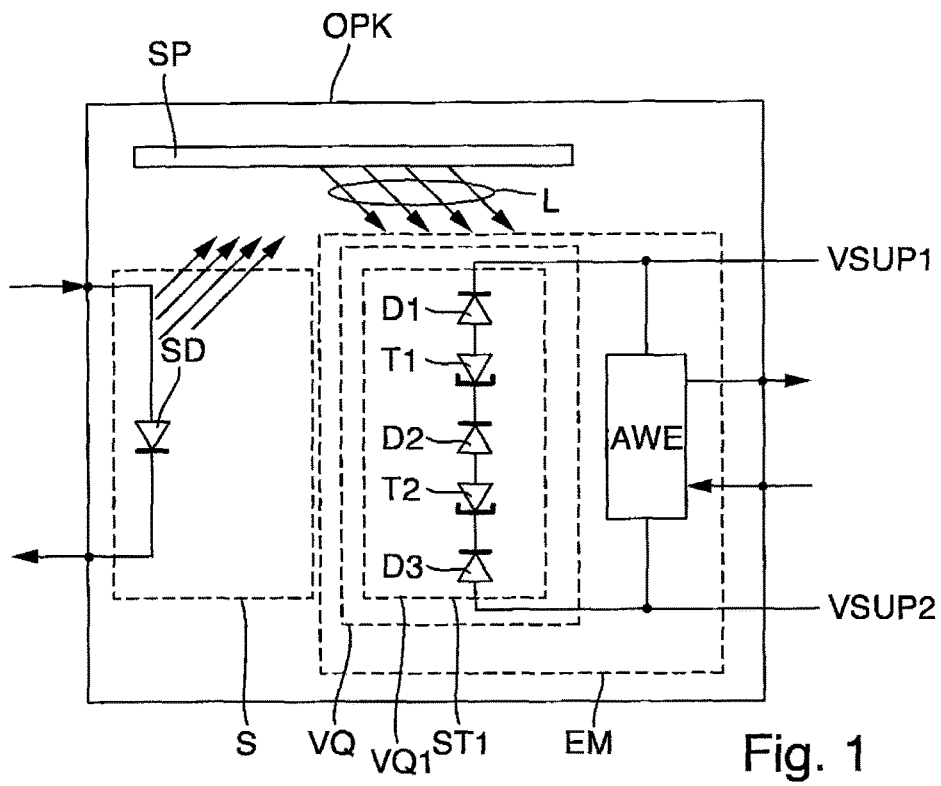
FIG. 1 illustrates an embodiment according to the invention of an optocoupler with a scalable voltage source with a stack.

FIG. 1 shows a schematic view of a first embodiment, comprising an optocoupler OPK with a transmitter module S with a transmitting diode SD and a receiver module EM. The receiver module EM has a scalable voltage source VQ and an evaluation unit AWE. It is understood that the notion of "scalability" refers to the level of the source voltage of the entire stack. By means of a mirror SP, the light L of the transmitting diode SD is directed onto the surface of a scalable voltage source VQ. It is understood that the optocoupler OPK is housed in this case, i.e., that the aforementioned components are integrated in the common housing.

The voltage source VQ has a first stack ST1 having a top surface and a bottom surface with a number N equal to three diodes. The first stack ST1 has a series circuit of a first diode D1 and a first tunnel diode T1 and a second diode D2 and a second tunnel diode T2, and a third diode D3. A first voltage terminal VSUP1 is formed at the top surface of the first stack ST1, and a second voltage terminal VSUP2 is formed at the bottom surface of the first stack ST1. The present source voltage is formed of the partial voltages of the individual diodes D1 to D3. To this end, the first stack ST1 is subjected to a photon flux L from the transmitting diode SD. Provided that the transmitting diode SD emits a modulated photon flux, the source voltage VQ1 of the first stack ST1 is also modulated in the first stack ST1.

The first stack ST1, comprising the diodes D1 to D3 and the tunnel diodes T1 and T2, is configured as a monolithically formed block. The evaluation unit AWE comprises an integrated circuit—not shown. The transmitter module S and the receiver module EM each have two galvanically isolated terminals.

Figure 2:
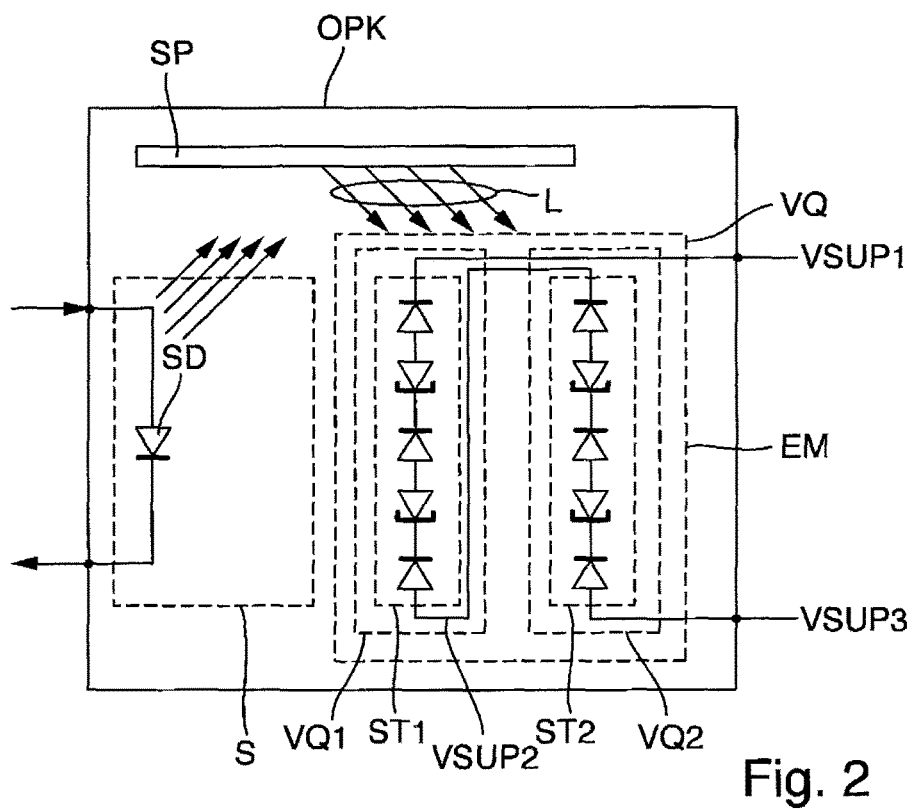
FIG. 2 illustrates an embodiment of an optocoupler with a scalable voltage source with multiple stacks.

The illustration of FIG. 2 shows another embodiment of the optocoupler of FIG. 1 with an advantageous sequence of the first stack ST1 and a second stack ST2. Below, only the differences from the picture of FIG. 1 are explained. The second stack ST2 has as the first batch ST1 a series circuit of three diodes with tunnel diodes formed therebetween. Both stacks ST1 and ST2 are connected together in series so that the source voltage VQ1 of the first stack ST1 and the source voltage VQ2 of the second stack ST2 can be added together, provided that the two stacks ST1 and ST2 are subjected to the photon flux L of the transmitting diode SD. In the present case, the receiver module EM has no evaluation circuit so that the first voltage terminal VSUP1 and the second voltage terminal VSUP3 are guided directly to the outside.

In one embodiment, not shown, the two stacks ST1 and ST2 comprise a different number of diodes with respect to one another, each connected in a series circuit. In another non-illustrated embodiment, at least the first stack ST1 and/or the second stack ST2 have more than three diodes connected in a series circuit. This makes it possible to scale the voltage level of the voltage source VQ. Preferably, the number N is within a range between four and eight.

Figure 3:
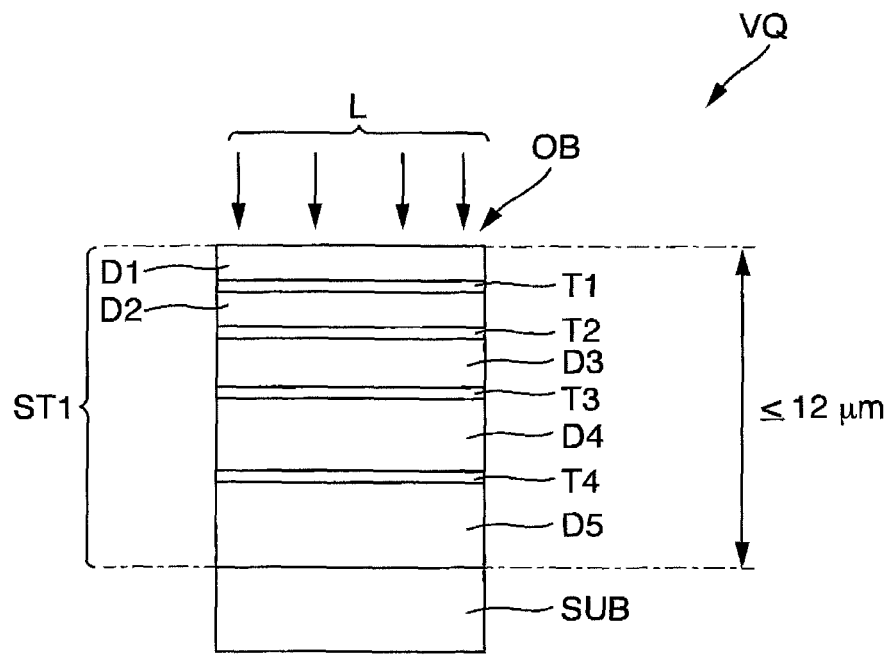
FIG. 3 illustrates an embodiment with a total of five diodes with different thicknesses of the absorption area'

The illustration of FIG. 3 shows an embodiment of an advantageous sequence of semiconductor layers for the first stack ST1. Below, only the differences from the picture of FIG. 1 are explained. The first stack ST1 includes a total of five series-connected partial voltage sources constructed as diodes D1 to D5. The light L is incident on the surface OB of the first diode D1. The surface OB is illuminated nearly completely, or completely. A tunnel diode T1-T4 is formed in each case between two successive diodes D1-D5. With increasing distance of the individual diode DI to D5 from the surface OB, the thickness of the absorption area increases so that the lowermost diode D5 has the thickest absorption region. Overall, the total thickness of the first stack ST1 is less than or equal to 12 microns. A substrate SUB is formed below the lowermost diode D5.

Figure 4:
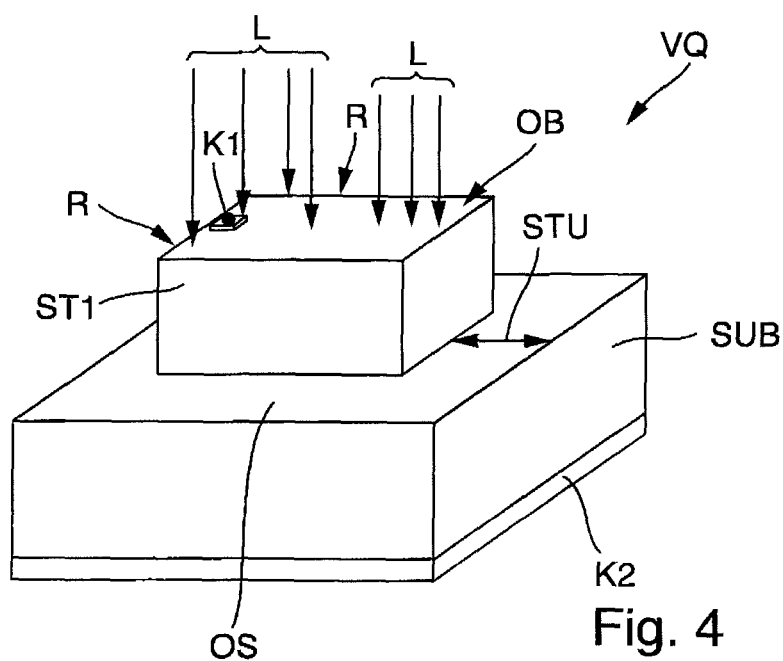
FIG. 4 illustrates a stack with a circumferential shoulder-like step.

The illustration of FIG. 4 shows an embodiment of an advantageous sequence of semiconductor layers to the first stack ST1 with a circumferential shoulder-like step. Below, only the differences from the picture of FIG. 3 are explained. A first metallic terminal contact K1 is formed on the edge R of the surface OB of the first stack ST1. The first terminal contact K1 is connected with the first voltage terminal VSUP1—not shown. The substrate SUB has a top surface OS, wherein the top surface OS of the substrate SUB is cohesively connected with the lowermost, i.e., the fifth diode D5. It is hereby understood that a thin nucleation layer and a buffer layer are produced epitaxially on the substrate before the fifth diode is arranged on the substrate and is cohesively bonded with the top surface OS of the substrate. The top surface OS of the substrate SUB has a larger surface area than the area at the bottom surface of the first stack ST1. This results in the formation of a circumferential step STU. The edge of the step STU is spaced apart from the immediately adjoining lateral surface of the first stack ST1 of the step by more than 5 microns and less than 500 microns, represented as the length of the reference numeral STU. At the bottom surface of the substrate SUB, a second whole-area metallic contact K2 is formed. The second terminal contact K2 is interconnected with the second voltage terminal VSUP2—not shown.

Figure 5A:
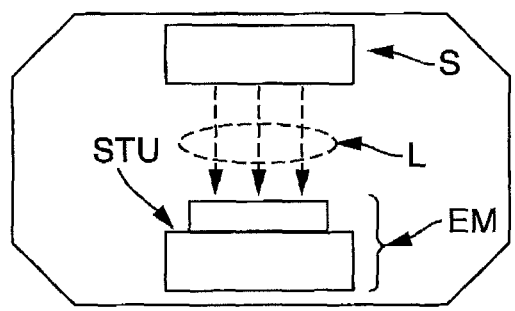
FIG. 5a illustrates a cross-sectional view of a vertical arrangement of transmitter to receiver module.
Figure 5B:
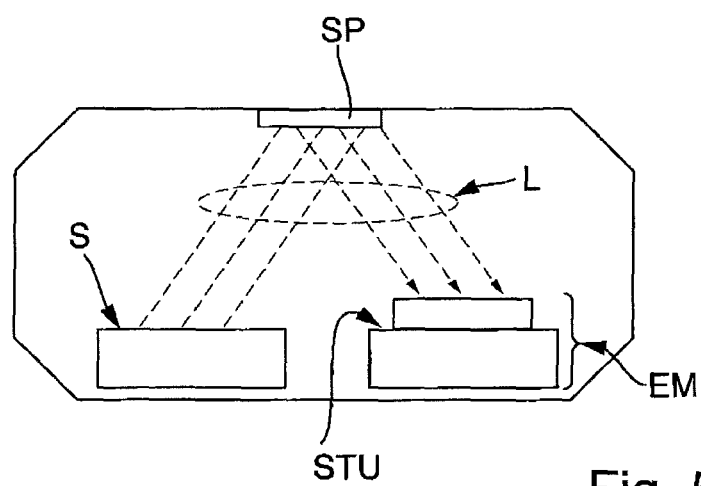
FIG. 5b illustrates a cross-sectional view of a lateral arrangement of transmitter to receiver module.

The illustrations of FIGS. 5a and 5b show a cross-sectional view of a vertical arrangement of transmitter module S and receiver module EM, and a cross-sectional view of a lateral arrangement of transmitter module S and receiver module EM, wherein the transmitter module S comprises a circumferential shoulder-like step with in each case the first stack ST1. Below, only the differences from the embodiments shown in the preceding figures are explained. It has been shown that in a vertical arrangement, a mirror SP is unnecessary. It is understood that based on the indicated parallel rays of light L, only the basic course of the light L is to be shown. Generally, the light of the transmitter module has a divergent light beam.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An optocoupler comprising:
   a transmitter module; and
   a receiver module, the transmitter module and the receiver module being galvanically isolated from each other and optically coupled with one another and integrated in a common housing, the receiver module comprising a plurality of N partial voltage sources mutually series-connected and constructed as semiconductor diodes,
   wherein each of the partial voltage sources have a semiconductor diode having a p-n junction, a p-doped absorption layer, and an n-absorption layer,
   wherein the n-absorption layer is passivated by an n-doped passivation layer having a wider band gap than a band gap of the n-absorption layer, the partial source voltages of the individual partial voltage sources deviating less than 20% from each other,
   wherein, between each two successive partial voltage sources, a tunnel diode is formed,
   wherein the tunnel diode has a plurality of semiconductor layers with a wider band gap than a band gap of the p/n absorption layers and the semiconductor layers having the wider band gap in each case are formed of a material with modified stoichiometry and/or other elemental composition than the p/n absorption layers of the semiconductor diode, wherein the partial voltage sources and the tunnel diodes are monolithically integrated together and jointly form a first stack having a top surface and a bottom surface, wherein the number N of the partial voltage sources is greater than or equal to three, wherein on the first stack, light is incident on a surface of the top surface of the first stack and a size of the illuminated top surface on the stack surface essentially or at least corresponds to a size of the surface of the first stack on the top surface, wherein the first stack has a total thickness of less than 12 microns, wherein at 300 K, the first stack has a source voltage of greater than 3 volts, provided that the first stack is irradiated with light, wherein, in a light incidence direction from a top surface of the first stack towards a bottom surface of the stack, a total thickness of the p/n absorption layers of a semiconductor diode increases from the top diode toward the lowermost diode and each p-absorption layer of the semiconductor diode is passivated by a p-doped passivation layer with a greater band gap than a band gap of the p-absorption layer and wherein a voltage source near a bottom side of the stack has a circumferential shoulder-like edge.

2. The optocoupler according to claim 1, wherein the partial source voltages of the partial voltage sources of the receiver module deviate by less than 10% from one another.

3. The optocoupler according to claim 1, wherein the semiconductor diodes of the receiver module each are formed of substantially the same semiconductor material.

4. The optocoupler according to claim 1, wherein the first stack is disposed on a substrate and wherein the substrate comprises a semiconductor material.

5. The optocoupler according to claim 1, wherein the first stack has a base area smaller than 2 mm$^2$ or smaller than 1 mm$^2$.

6. The optocoupler according to claim 1, wherein, on the top surface of the first stack of the receiver module, a first voltage terminal is formed as a circumferential metal contact in a vicinity of an edge or as a single contact surface on the edge.

7. The optocoupler according to claim 1, wherein on a bottom surface of the first stack of the receiver module, a second voltage terminal is formed.

8. The optocoupler according to claim 7, wherein the second voltage terminal of the receiver module is formed by the substrate.

9. The optocoupler according to claim 1, wherein in the receiver module, a second stack is formed, wherein the first stack and the second stack are arranged side by side on a common carrier, and wherein the first and second stacks are connected to one another in series so that a source voltage of the first stack and a source voltage of the second stack are added together.

10. The optocoupler according to claim 1, wherein, between the p-absorption layer and the n-absorption layer of each diode of the receiver module, an intrinsic layer is formed.

11. The optocoupler according to claim 1, wherein the semiconductor material and/or the substrate of the receiver module is formed of III-V materials.

12. The optocoupler according to claim 1, wherein the substrate of the receiver module comprises germanium or gallium arsenide.

13. The optocoupler according to claim 1, wherein an evaluation circuit is integrated in the housing and the voltage source is in electrical operative connection with the evaluation circuit.

14. The optocoupler according to claim 1, wherein, below the lowermost semiconductor diode of the stack of the receiver module, a semiconductor mirror is formed.

15. The optocoupler according to claim 1, wherein the semiconductor layers of the stack of the receiver module comprise arsenide-containing and phosphide-containing layers.

16. The optocoupler according to claim 1, wherein a border of the edge is spaced apart by at least 5 microns and maximally 500 microns from the immediately adjoining lateral surface of the stack.

* * * * *